United States Patent
Komuro et al.

(10) Patent No.: US 7,199,504 B2
(45) Date of Patent: Apr. 3, 2007

(54) FILM BULK ACOUSTIC RESONATOR FILTER

(75) Inventors: Eiju Komuro, Tokyo (JP); Masaaki Imura, Tokyo (JP); Qingxin Su, Beijing (CN); Paul B. Kirby, Northampton (GB); Roger W. Whatmore, Milton Keynes (GB)

(73) Assignee: TDK Corporation, Tokyo (JP)

( * ) Notice: Subject to any disclaimer, the term of this patent is extended or adjusted under 35 U.S.C. 154(b) by 437 days.

(21) Appl. No.: 10/718,799

(22) Filed: Nov. 24, 2003

(65) Prior Publication Data

US 2004/0150295 A1 Aug. 5, 2004

Related U.S. Application Data

(62) Division of application No. 10/380,985, filed as application No. PCT/GB01/03141 on Jul. 11, 2001.

(30) Foreign Application Priority Data

Nov. 29, 2000 (GB) ................................. 0029090.8

(51) Int. Cl.
H03H 9/54 (2006.01)
(52) U.S. Cl. ...................... 310/320; 310/365; 310/366; 333/189
(58) Field of Classification Search ................ 310/320, 310/365–366; 333/189–199
See application file for complete search history.

(56) References Cited

U.S. PATENT DOCUMENTS

| | | | |
|---|---|---|---|
| 5,185,589 A | | 2/1993 | Krishnaswamy et al. |
| 5,382,930 A | * | 1/1995 | Stokes et al. ............... 333/191 |
| 5,604,393 A | * | 2/1997 | Suzuki et al. ............... 333/193 |
| 5,854,579 A | * | 12/1998 | Penunuri .................... 333/193 |
| 5,872,493 A | * | 2/1999 | Ella ........................... 333/191 |
| 5,932,953 A | * | 8/1999 | Drees et al. ................ 310/324 |
| 5,942,958 A | | 8/1999 | Lakin |
| 6,051,907 A | | 4/2000 | Ylilammi |
| 6,262,637 B1 | * | 7/2001 | Bradley et al. ............. 333/133 |
| 2001/0013815 A1 | * | 8/2001 | Sawada ....................... 333/193 |
| 2003/0205948 A1 | * | 11/2003 | Lin et al. ..................... 310/312 |
| 2003/0227338 A1 | * | 12/2003 | Kawakubo et al. ....... 331/107 A |

FOREIGN PATENT DOCUMENTS

| | | |
|---|---|---|
| EP | 0 865 157 A2 | 9/1998 |
| EP | 0 880 227 A2 | 11/1998 |
| EP | 0 949 756 A2 | 10/1999 |

* cited by examiner

*Primary Examiner*—Darren Schuberg
*Assistant Examiner*—J. Aguirrechea
(74) *Attorney, Agent, or Firm*—Oliff & Berridge, PLC

(57) ABSTRACT

A ladder-type film bulk acoustic resonator (FBAR) filter comprises two series FBARs and two parallel FBARs. Each FBAR has a top electrode, a bottom electrode, and a piezoelectric layer sandwiched between the top and bottom electrodes. The top electrodes of the two series FBARs form part of a signal line of a coplanar waveguide transmission line. The top electrodes of the two series FBARs are connected to associated circuitry. The two series FBARs have a common bottom electrode.

4 Claims, 6 Drawing Sheets

FILM BULK ACOUSTIC RESONATOR FILTER

This is a Division of U.S. application Ser. No. 10/380,985 filed Mar. 20, 2003, which in turn is a U.S. National Stage Application of PCT/GB01/03141 filed Jul. 11, 2001. The entire disclosure of the prior application(s) is hereby incorporated by reference herein in its entirety.

BACKGROUND OF THE INVENTION

1. Field of the Invention

The present invention relates to a film bulk acoustic resonator (FBAR) filter, and more especially to an FBAR filter operating at microwave frequencies which can be simply fabricated using thin film technologies.

2. Description of the Related Art

It is important to prepare filters at high frequency in the MHz or GHz region because those frequency regions are often used for wireless communications these days. For such applications it is important that the filter is as small size as possible. Therefore, filter configurations are demanded which minimise the size of the filter on the substrate surface.

FBARs are attractive devices since they show resonant peaks at high frequency particularly in the MHz and GHz regions. Moreover, FBARs can be achieved in a small device (size ~100 microns). Thus, they are considered to be useful for installation in small, light, thin electric appliance products, such as mobile phones.

FBARs are fabricated by depositing thin film piezoelectric layers, typically zinc oxide (ZnO), aluminium nitride (AlN) or lead zirconium titanate (PZT) onto a membrane or acoustic quarter wavelength stack formed on a semiconductor substrate. This combination forms an acoustic structure which is resonant at a specific frequency.

Prior art FBAR devices are coupled to associated circuitry by means of contact pads and wire bonds. This method provides a poorly defined ground connection because of the parasitic inductance of the wire leads. This approach also makes simulations and analysis of results difficult.

An alternative approach of incorporating the FBAR within a coplanar waveguide (CPW) structure involves the signal connection of the ground-signal-ground connection making contact to the top and bottom of the piezoelectric layer. In the known arrangement the electrodes are separate from the transmission line structure. This increases the area and limits the size of device that can be produced.

OBJECT AND SUMMARY OF THE INVENTION

It is an object of the invention to provide a film bulk acoustic resonator filter which is small in size and easy to fabricate.

A first film bulk acoustic resonator filter of the invention comprises a plurality of film bulk acoustic resonators each having a top electrode, a bottom electrode, and a piezoelectric layer sandwiched between the top and bottom electrodes, wherein the top electrodes of at least two of the film bulk acoustic resonators are connected to associated circuitry.

In the first film bulk acoustic resonator filter of the invention, the top electrodes of the at least two of the film bulk acoustic resonators connected to the associated circuitry may form part of transmission lines of a coplanar waveguide structure.

In the first film bulk acoustic resonator filter of the invention, the at least two of the film bulk acoustic resonators with the top electrodes connected to the associated circuitry may have a common bottom electrode.

A second film bulk acoustic resonator filter of the invention is a ladder-type film bulk acoustic resonator filter comprising at least two series resonators and at least two parallel resonators, each made of a film bulk acoustic resonator having a top electrode, a bottom electrode, and a piezoelectric layer sandwiched between the top and bottom electrodes, wherein the top electrodes of two of the series resonators are connected to associated circuitry.

In the second film bulk acoustic resonator filter of the invention, the top electrodes of the two of the series resonators connected to the associated circuitry may form part of a signal line of a coplanar waveguide transmission line.

In the second film bulk acoustic resonator filter of the invention, the two of the series resonators with the top electrodes connected to the associated circuitry may have a common bottom electrode.

By configuring the filter as a CPW structure, a compact filter is obtained that is not susceptible to stray parasitic effects. Furthermore, incorporating the filter within the coplanar transmission line structure eliminates the need for wire bonds, thereby simplifying fabrication.

Preferably the filter is a ladder filter in which the series FBARs form one group and the parallel FBARs form another group. The advantage of the ladder filter configuration is that additional passive capacitance and inductors that take up additional area are not required. Generally speaking, for a band-pass filter, the rejection level compared to the signal-pass area improves when more FBARs are used in the filter. According to the present invention, there is provided a filter made up of a plurality of FBARs which is small in size and shows low close-in rejection and low out-of-band rejection.

Typically, the series FBARs have identical areas and thicknesses and similarly the parallel FBARs have identical areas and thicknesses although both area and thickness can be different for the series and parallel FBARs. Identical series FBAR will be referred to as an "A" type FBAR, identical parallel FBARs will be referred to as a "B" type FBAR.

The series and parallel FBARs may be arranged in an ABAB sequence or in an ABBA sequence. The ABAB configuration in a CPW structure takes up more area compared to the ABBA configuration and adopting the ABBA configuration enables full use to be made of the device area.

The ABBA configuration within a CPW is also well suited to simple fabrication of a miniature filter using thin film technology and also allows easy fabrication of higher order filters without having to pattern the piezoelectric layer.

The FBARs may be positioned without air-bridges or metal tracks formed over the edge of the piezoelectric layer.

Advantageously, the piezoelectric material for the piezoelectric layer is selected from the group comprising zinc oxide, aluminium nitride, lead titanate zirconate, lead scandium tantalum oxide and bismuth sodium titanium oxide.

When the piezoelectric layer is ferroelectric, it is preferable to provide access to electrodes for poling the piezoelectric layer.

In the present invention, the top electrode of each series FBAR may form part of a signal line of a coplanar waveguide structure and the top electrode of each parallel FBAR may form part of a ground line of the coplanar waveguide structure. Preferably, the signal line is positioned between two ground lines.

According to the present invention, it is possible to implement a film bulk acoustic resonator filter which is small in size and easy to fabricate.

Other and further objects, features and advantages of the invention will appear more fully from the following description.

DETAILED DESCRIPTION OF THE PREFERRED EMBODIMENT

Embodiments of the invention are now described in more detail, by way of example only, with reference to the accompanying drawings.

Figure 1:
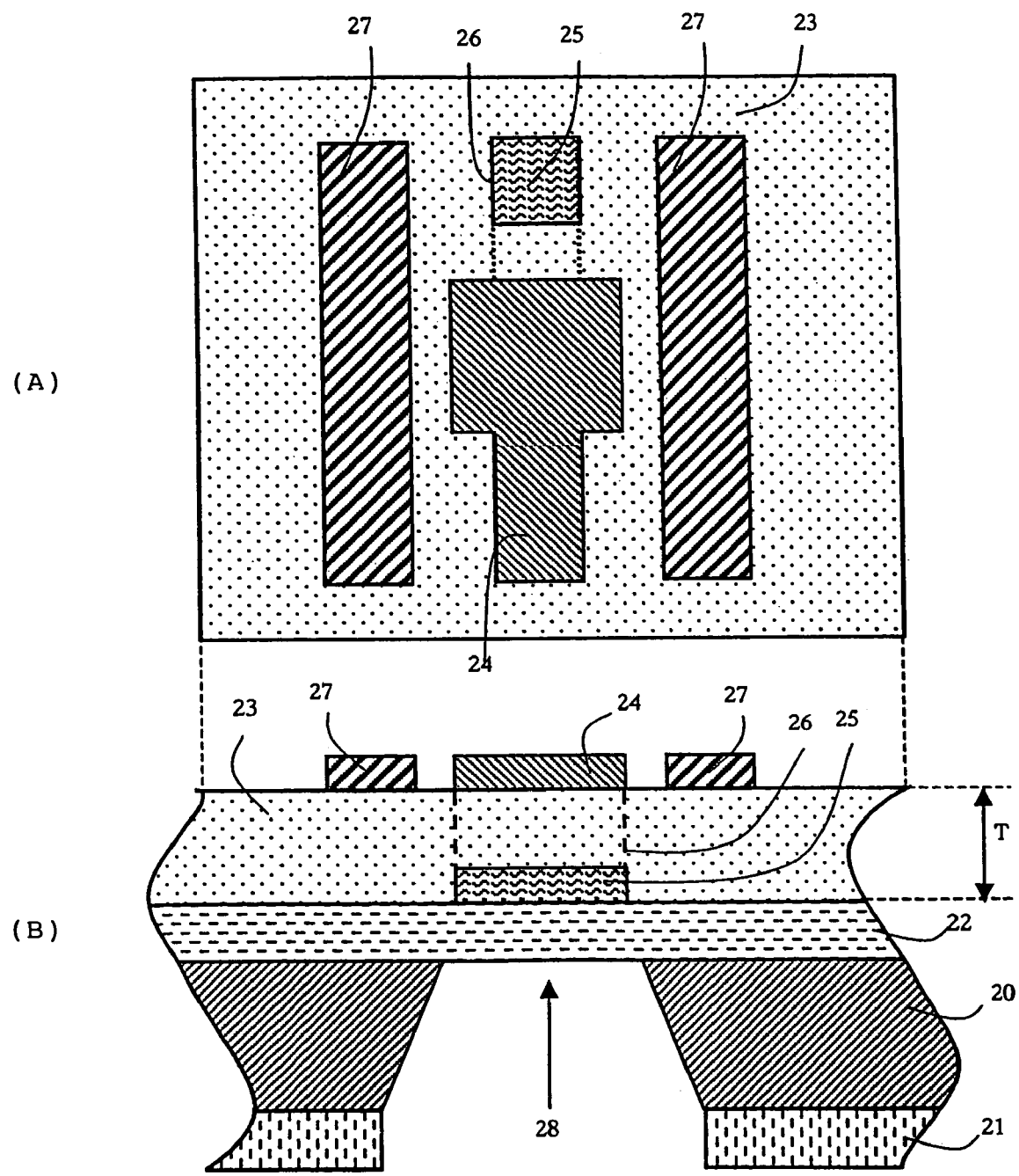
In FIG. 1, (A) is a top view of an FBAR and (B) is a cross-sectional view of the FBAR shown in (A).

Referring first to FIG. 1(A) and FIG. 1(B), a top view and a cross-sectional view of a standard FBAR are shown. The FBAR is arranged on the signal line of a ground-signal-ground line of a coplanar transmission line.

The device is configured for 2-port measurements so ground probes can be positioned at either end of ground electrodes 27, one signal probe can be positioned through a contact hole 26 onto the bottom electrode 25, and the other signal probe can be positioned at the end of the top electrode 24.

The dimensions of the coplanar transmission lines are designed to provide the system with a 50 ohm environment however there is enough design flexibility to allow the distance between ground and signal lines to be altered to accommodate FBARs of varying area while minimising the overall size of the FBAR and FBAR filter.

The FBAR consists of a continuous piezoelectric layer 23 deposited on an insulating layer 22. An input electrode which forms the bottom electrode 25 of the FBAR is formed on the insulating layer 22 and is configured as part of the signal line of a coplanar transmission line.

The region of overlap of the signal line defined on the insulating layer 22 and that part of the signal line defined on the top of the piezoelectric layer 23 is positioned above the opening 28 in the substrate 20. The opening 28 is prepared by etching using backside pattern 21.

The output transmission line extends to measurement points or to other FBARs arranged in a ladder configuration. Using a continuous piezoelectric thin film, the input and output electrode must be defined before and after the deposition of the piezoelectric thin film. When the top electrode 24 is prepared, two ground electrodes 27 are prepared at the same time so that the top electrode 24 has a coplanar waveguide structure for which the characteristic impedance is set to about 50 ohms.

Access to the bottom electrode 25 of the FBAR for measurements is achieved by etching a contact hole 26. The size of the working area, which is equal to the centre part of the top electrode 24 and the bottom electrode 25, is typically 50–200 microns square for ZnO and 20–45 microns square for PZT.

Figure 2:
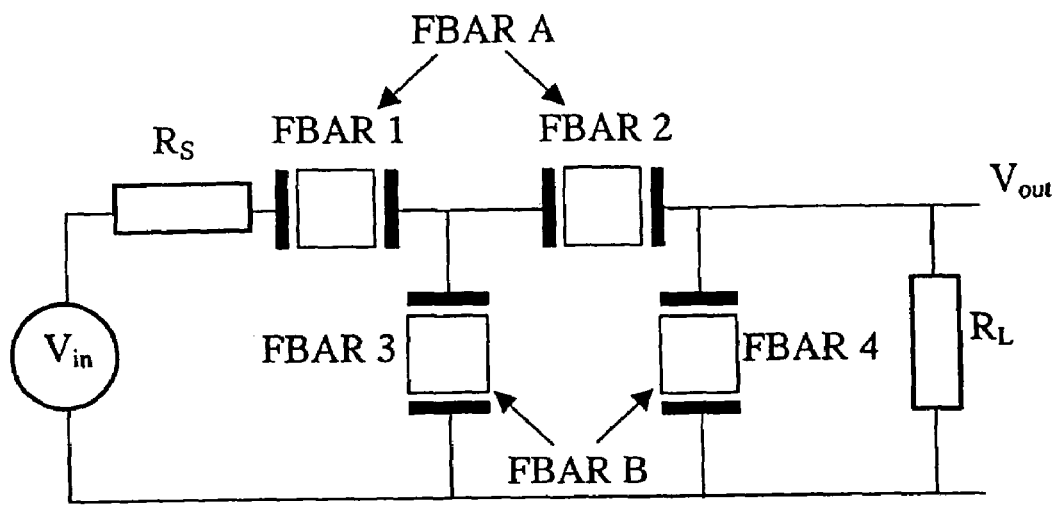
FIG. 2 is a schematic diagram of an ABAB ladder filter.
Figure 3:
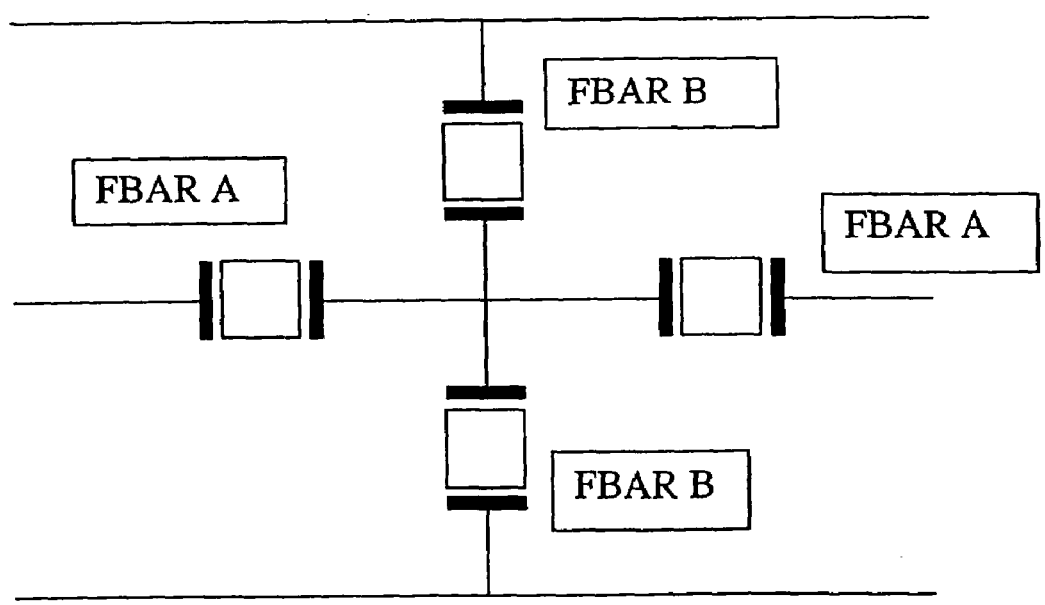
FIG. 3 is a schematic diagram of an ABBA ladder filter.

FIG. 2 and FIG. 3 are schematic views of two arrangements of series and parallel FBARs to form ladder filters. Each filter comprises two FBARs in series and two FBARs in parallel. Such filters are referred to by a common nomenclature, as 2×2 ladder filters where the first numeral refers to the number of series resonators and the second numeral to the number of parallel resonators. For convenience herein, the series resonators will be denoted A and the parallel resonators B. The series resonators A may often differ in area and thickness from the parallel resonators B. All series resonators A are identical and all parallel resonators B are identical.

The arrangement of FBARs in FIG. 2 and FIG. 3 differ in terms of the grounding sequence. The arrangement in FIG. 2 is here referred to as ABAB whereas that in FIG. 3 is referred to as the ABBA configuration with these terms describing the sequence of the series and parallel resonators.

The realisation of the 2×2 filter in the ABBA coplanar configuration shown in FIG. 3 is illustrated in FIGS. 4A–D with dimensions suitable for a ZnO piezoelectric layer 23 while that of the 2×2 filter in ABAB coplanar configuration shown in FIG. 2 is illustrated in FIGS. 5A–D.

In either of the two examples, the top electrodes 24 and 27 form part of transmission lines of the coplanar waveguide structure. The top electrodes 24 and 27 are connected to associated circuitry. At least two of the FBARS in which the top electrodes are connected to the associated circuitry have the common bottom electrode 25. Moreover, in either of the examples, the top electrodes 24 of the two series FBARs 10 form part of a signal line of the coplanar waveguide transmission line. The signal line is positioned between the two ground electrodes 27. The top electrodes 24 of the two series FBARs 10 are connected to the associated circuitry. The two series FBARs 10, which are connected to the associated circuitry via the top electrodes 24, have the common bottom electrode 25.

The series FBARs 10 and the parallel FBARs 11 are positioned on a single membrane structure. The invention simplifies the processing considerably and eliminates the need to pattern by etching the ZnO piezoelectric layer 23. For the ABBA and ABAB configurations within a coplanar transmission line, one layer forms the bottom electrode 25 of all four FBARs that make up the 2×2 filter.

As a result of using ABBA configured filter within CPW, certain orders of ladder filters, in which the number of parallel FBARs is equal or bigger than that of the series FBARs, such as ABBABBA (3/4), ABBABBAA (4/4) are easier to fabricate within a CPW.

For filters with ABAB configuration in simple CPW, it is difficult to fabricate filters with the same number of series and parallel FBARS, such as ABABAB (3/3) without forming piezoelectric mesas by etching. A mesa is necessary to be able to run a top electrode metal pattern down the side of the piezoelectric material in an FBAR so that it can form the bottom electrode of the following FBAR. Only filters with the number of parallel FBARs less than the number of series FBARs, such as ABAAB (3/2), can be fabricated without piezoelectric material etching.

The ABBA structure can be used in other waveguide configurations, for example, microstrip, but a greater area is taken up by the filter than when used in the ABAB configuration. For an ABBA filter within a microstrip, a transmission configuration for an electrode to be able to connect a top electrode on the piezoelectric material to a bottom electrode on the next FBAR necessitates etching a piezoelectric mesa or the use of air-bridge technology.

Figure 4A:
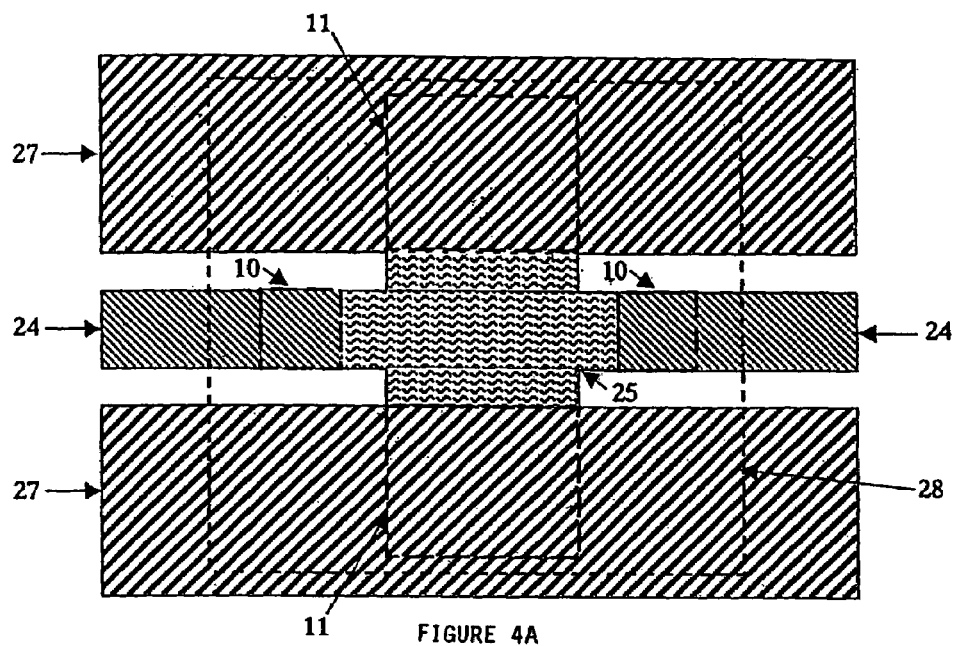
FIG. 4A is a top view of a ladder filter according to a first embodiment of the invention having the ABBA configuration shown in FIG. 3.
Figure 4B:
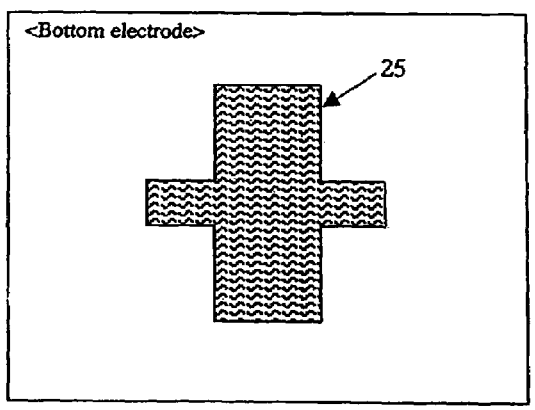
FIG. 4B shows the bottom electrode of the ABBA ladder filter shown in FIG. 4A.
Figure 4C:
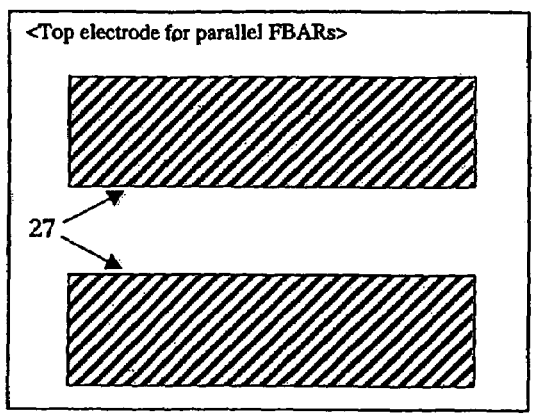
FIG. 4C shows the top electrode for the parallel FBARs of the ABBA ladder filter shown in FIG. 4A.
Figure 4D:
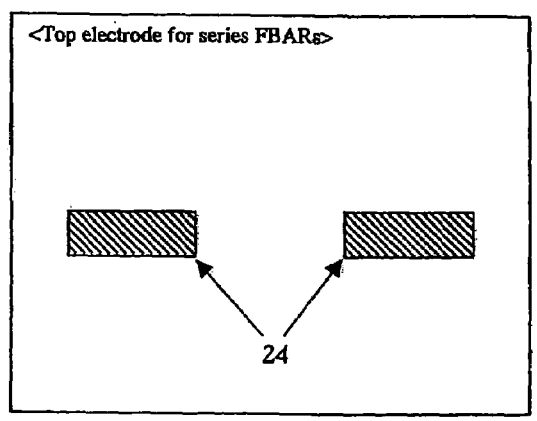
FIG. 4D shows the top electrode for the series FBARs of the ABBA ladder filter shown in FIG. 4A.

The top surface fabrication sequence for the filter containing 4 FBARs arranged in the ABBA configuration shown in FIG. 4A is now described. First the bottom electrode 25 metallised pattern is defined by prior art fabrication techniques. A piezoelectric layer 23 is then deposited over the whole surface.

The filter is then completed by depositing either one or two top electrode 24 metallised patterns depending on whether different metal thickness and hence different frequencies are required for the series and parallel FBARs in accordance with prior art.

The final fabrication stage is the formation of the opening 28 under insulating layer 22 by the techniques of bulk silicon etching or deep reactive etching as well known by those versed in the art.

Figure 5A:
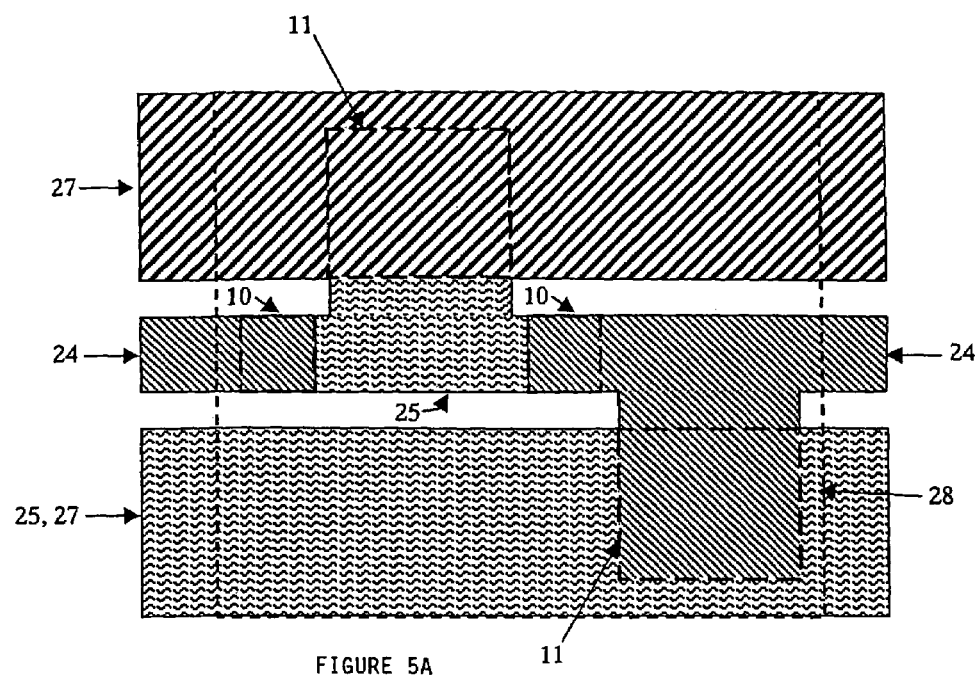
FIG. 5A is a top view of a ladder filter according to a second embodiment of the invention having the ABAB configuration shown in FIG. 2.
Figure 5B:
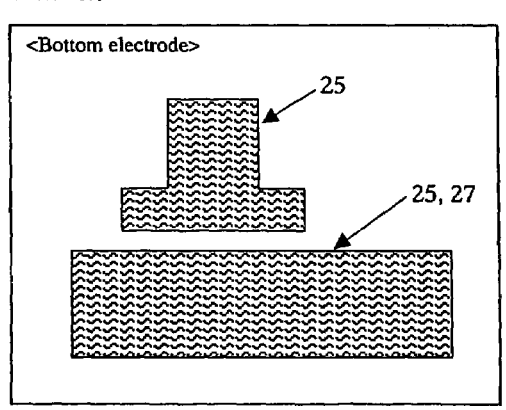
FIG. 5B shows the bottom electrode of the ABAB ladder filter shown in FIG. 5A.
Figure 5C:
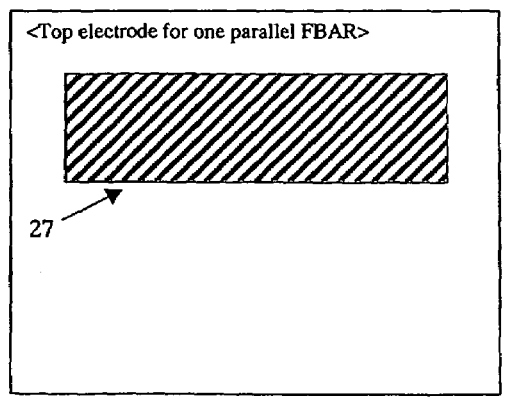
FIG. 5C shows the top electrode for the parallel FBARs of the ABAB ladder filter shown in FIG. 5A.
Figure 5D:
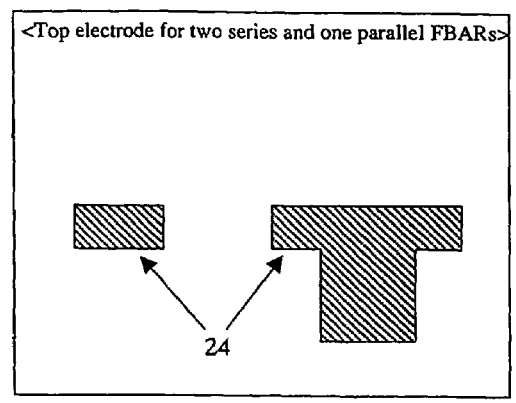
FIG. 5D shows the top electrode for the series FBARs of the ABAB ladder filter shown in FIG. 5A.

The fabrication steps for the ABAB filter shown in FIG. 5A are similar to those for the ABBA configuration, although the order of layer fabrication varies.

Figure 6A:
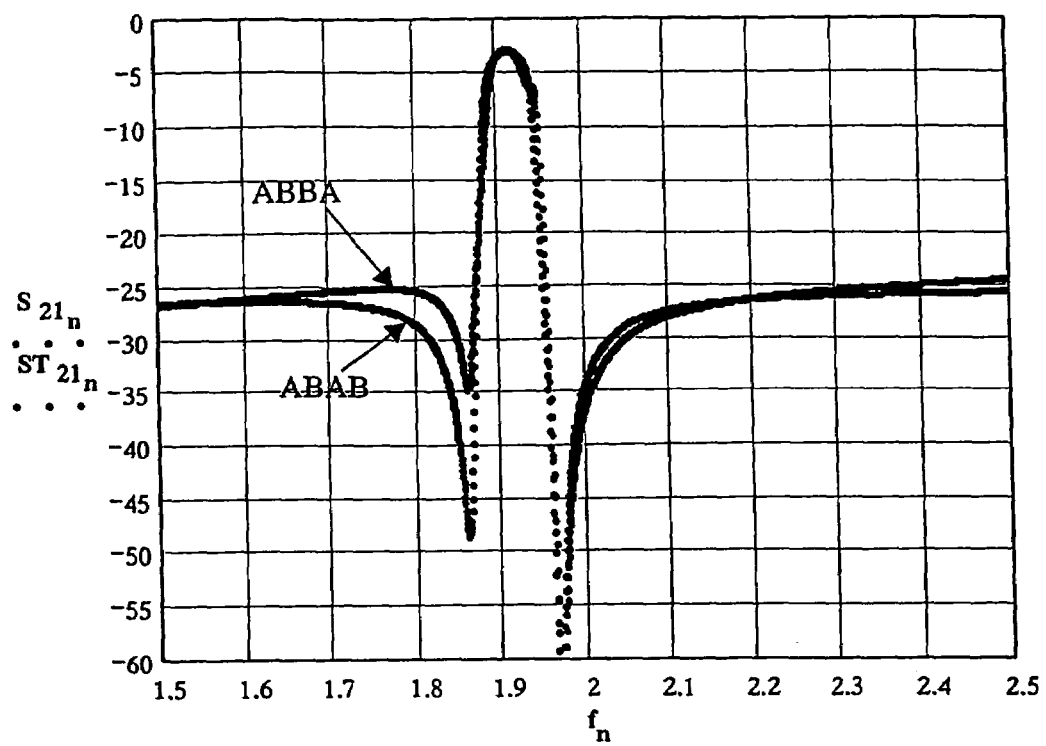
FIG. 6A and FIG. 6B show modelled comparisons of the S-parameters of the ABAB and ABBA ladder filters shown in FIG. 4A and FIG. 5A.
Figure 6B:
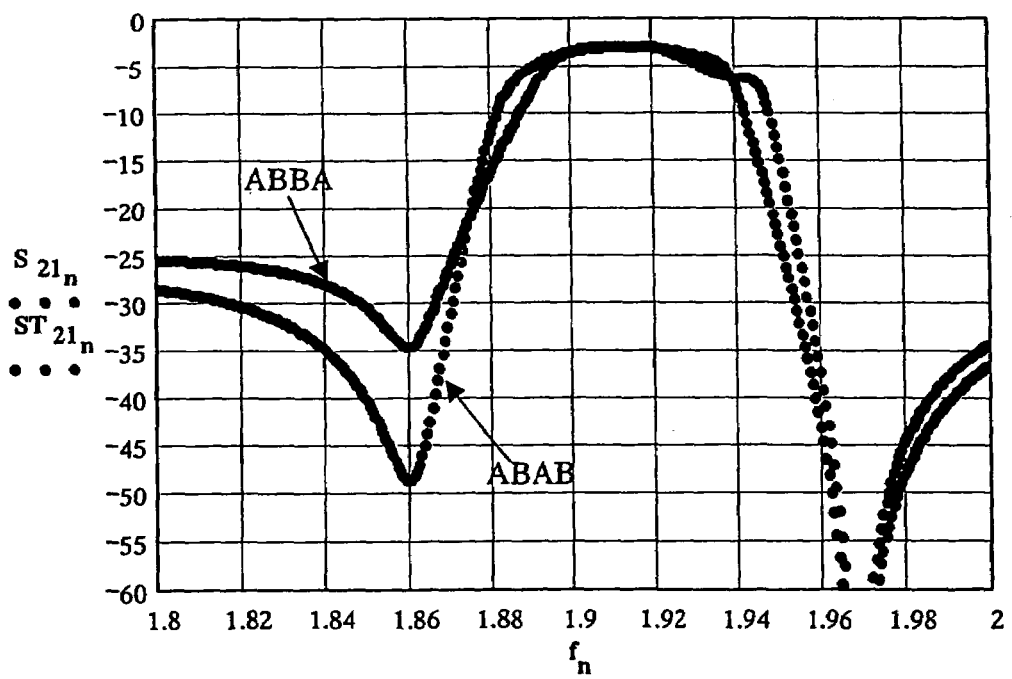
Figure 7A:
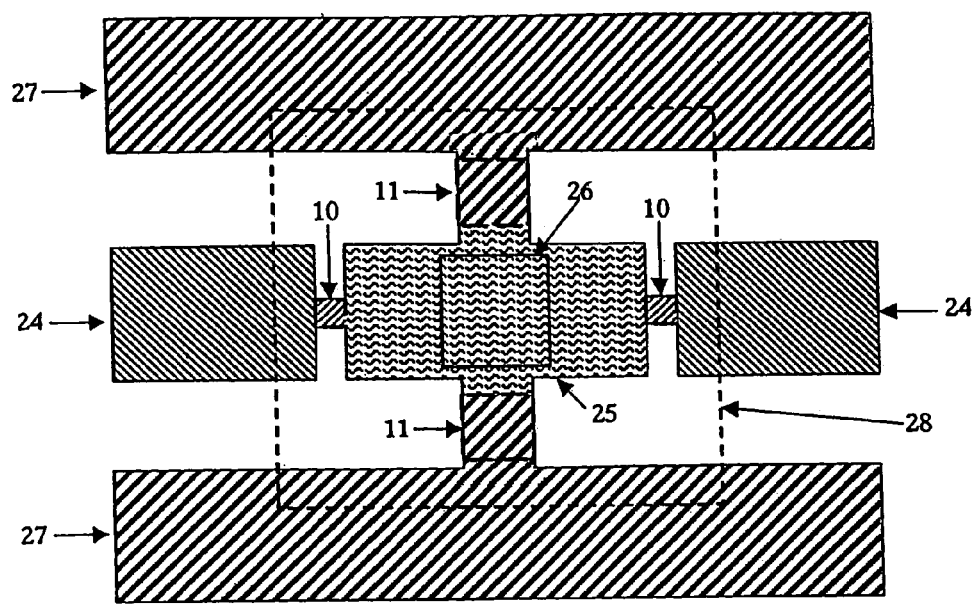
FIG. 7A is a top view of an ABBA ladder filter similar to FIG. 4A with ferroelectric layers according to a third embodiment of the invention.
Figure 7B:
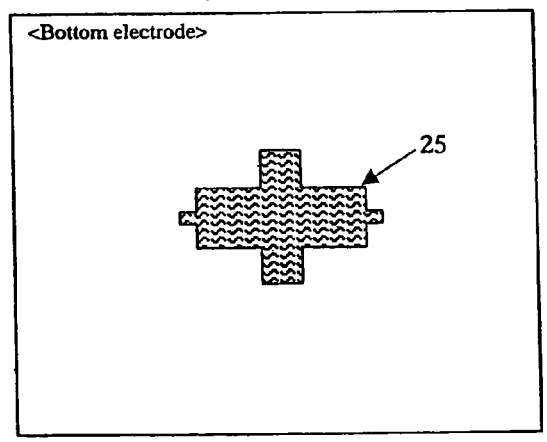
FIG. 7B shows the bottom electrode of the ABBA ladder filter shown in FIG. 7A.
Figure 7C:
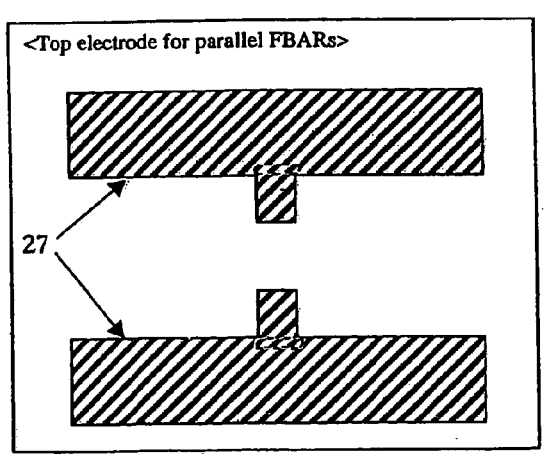
FIG. 7C shows the top electrode for the parallel FBARs of the ABBA ladder filter shown in FIG. 7A.
Figure 7D:
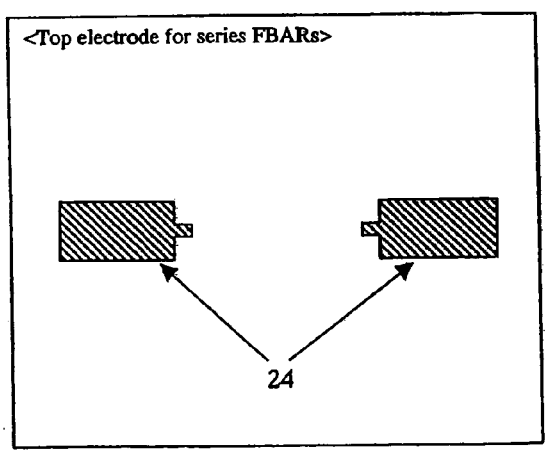
FIG. 7D shows the top electrode for the series FBARs of the ABBA ladder filter shown in FIG. 7A.

The through coefficient ($S_{21}$) of 2×2 ZnO FBAR filters having the ABAB and ABBA configurations are compared in FIGS. 6A, 6B. The filters have the same insertion loss and little difference in the out-of-band rejection. The ABAB configuration has greater close-in rejection, sharper roll-off and slightly larger bandwidth than that obtained from the ABBA configuration. The ABBA configuration can have a flatter pass-band.

A further embodiment of 2×2 ladder filter according to the invention for use with piezoelectric layers 23 that are also ferroelectric and so need to be poled is shown in FIGS. 7A–D. The fabrication procedure is identical to that for the ZnO FBAR filters described above except that a contact hole 26 is made to the common bottom electrode 25. Using this contact hole, 26, for poling in the ABBA configuration allows access to the common bottom electrode 25 eliminating the need to make multiple bottom electrode connections on a single filter. With the ABAB configuration, extra contact holes are needed for poling.

Obviously many modifications and variations of the present invention are possible in the light of the above teachings. It is therefore to be understood that within the scope of the appended claims the invention may be practiced otherwise than as specifically described.

What is claimed is:

1. A film bulk acoustic resonator filter comprising a plurality of film bulk acoustic resonators each having a top electrode, a bottom electrode, and a piezoelectric layer sandwiched between the top and bottom electrodes, wherein the piezoelectric layer is a single layer and is not divided into separate layers for the respective film bulk acoustic resonators, and the top electrodes of at least two of the film bulk acoustic resonators are connected to associated circuitry, the film bulk acoustic resonator filter further comprising a transmission line of a coplanar waveguide structure, the transmission line being disposed on the single piezoelectric layer and having two ground lines and a signal line disposed between the ground lines, wherein each of the top electrodes of the at least two of the film bulk acoustic resonators connected to the associated circuitry forms part of the transmission line of the coplanar waveguide structure.

2. A film bulk acoustic resonator filter according to claim 1, wherein the at least two of the film bulk acoustic resonators with the top electrodes connected to the associated circuitry have a common bottom electrode.

3. A ladder-type film bulk acoustic resonator filter comprising at least two series resonators and at least two parallel resonators, each made of a film bulk acoustic resonator having a top electrode, a bottom electrode, and a piezoelectric layer sandwiched between the top and bottom electrodes, wherein the piezoelectric layer is a single layer and is not divided into separate layers for the respective film bulk acoustic resonators, and the top electrodes of two of the series resonators are connected to associated circuitry, the film bulk acoustic resonator filter further comprising a transmission line of a coplanar waveguide structure, the transmission line being disposed on the single piezoelectric layer and having two ground lines and a signal line disposed between the ground lines, wherein each of the top electrodes of the two of the series resonators connected to the associated circuitry forms part of the signal line of the transmission line of the coplanar waveguide structure.

4. A ladder-type film bulk acoustic resonator filter according to claim 3, wherein the two of the series resonators with the top electrodes connected to the associated circuitry have a common bottom electrode.

* * * * *